United States Patent [19]
Shepherd

[11] 3,971,994
[45] July 27, 1976

[54] FREQUENCY COMPARISON CIRCUIT
[75] Inventor: Geoffrey Shepherd, Oldham, England
[73] Assignee: Ferranti, Limited, Hollinwood, England
[22] Filed: Feb. 11, 1974
[21] Appl. No.: 441,315

[30] Foreign Application Priority Data
Feb. 17, 1973 United Kingdom............6769/73

[52] U.S. Cl............................. 328/133; 307/233 R; 324/79 D
[51] Int. Cl.².................. G01R 23/00; H03D 13/00; H03K 5/20
[58] Field of Search................. 328/133; 307/233 R; 329/50, 104, 126; 324/79 D, 83 FE; 325/320; 235/92 TF, 92 CC, 92 EA, 92 CP, 92 FQ, 92 R

[56] References Cited
UNITED STATES PATENTS

| | | | |
|---|---|---|---|
| 3,312,903 | 4/1967 | Webb............................. | 328/133 X |
| 3,512,085 | 5/1970 | Peterson et al................. | 328/133 X |
| 3,657,732 | 4/1972 | Kranse........................... | 328/133 X |
| 3,670,250 | 6/1972 | Fritkin........................... | 325/320 X |
| 3,808,407 | 4/1974 | Ratz.............................. | 328/133 X |
| 3,813,604 | 5/1974 | Denoncourt................... | 328/133 X |
| 3,814,918 | 6/1974 | Nash et al..................... | 325/320 X |
| 3,879,665 | 4/1975 | Carlow et al.................. | 329/104 X |

Primary Examiner—Siegfried H. Grimm
Attorney, Agent, or Firm—Cameron, Kerkam, Sutton, Stowell & Stowell

[57] ABSTRACT

A circuit arrangement for indicating when the pulse repetition frequencies of two pulse trains differ by a predetermined amount comprises a multi-stage shift register containing a binary digit in one of the central stages, pulses from each train are applied to the register alternately by means of clock pulses and individual pulses of each train cause the binary digit to be moved through one stage but in opposite senses. While the repetition frequencies are equal the binary digit oscillates between two stages but if unequal numbers of pulses are received in each train then the binary digit migrates along the stages of the register. An output signal is derived from stages of the register displaced by a predetermined number from the central stages. The circuit is reset after a predetermined number of input pulses so that the percentage difference between the two repetition frequencies is indicated.

10 Claims, 1 Drawing Figure

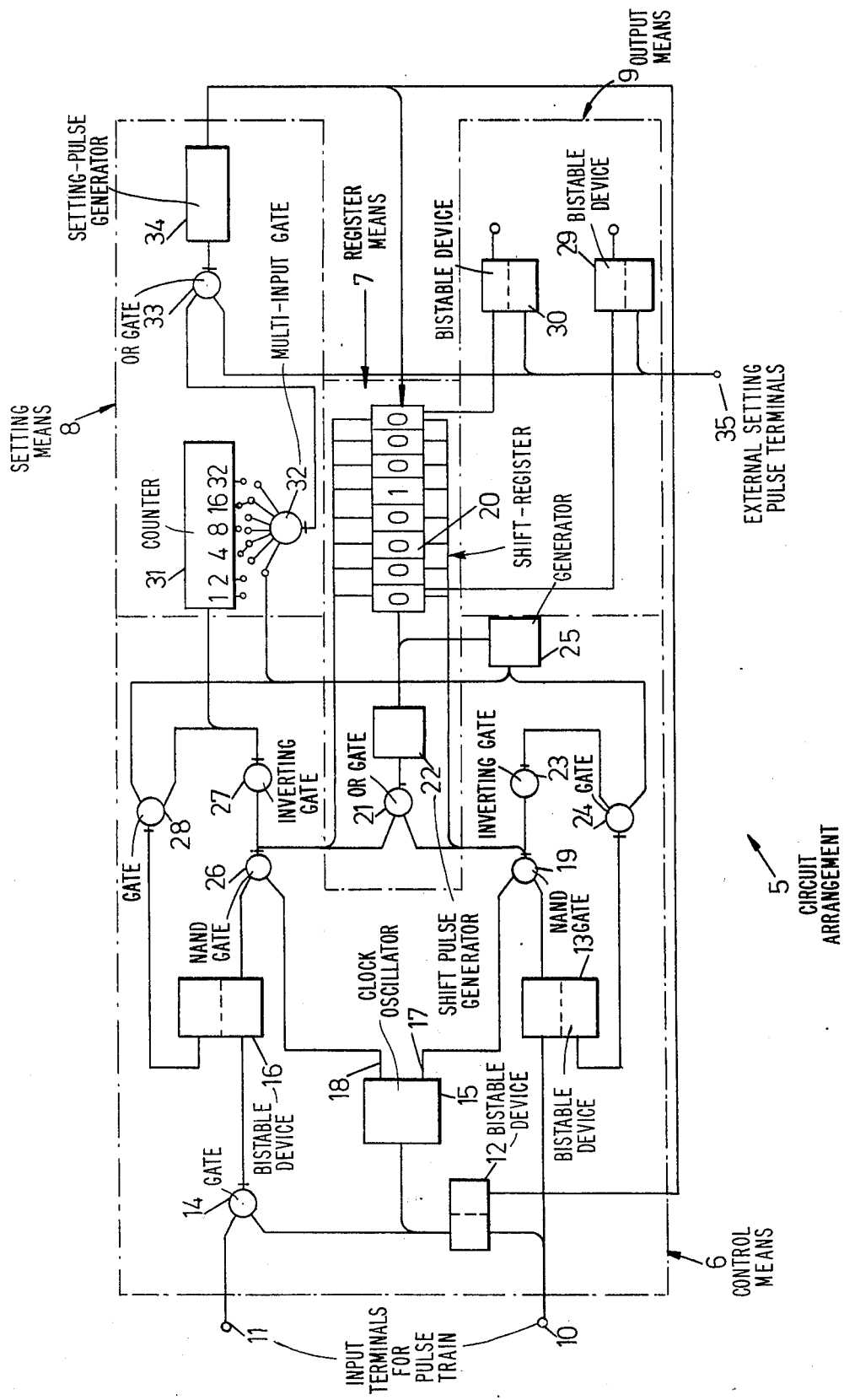

FREQUENCY COMPARISON CIRCUIT

This invention relates to frequency comparison circuit arrangements and particularly to such circuit arrangements in which a predetermined difference between two pulse repetition frequencies is indicated.

It is an object of the present invention to provide a novel pulse frequency comparison circuit arrangement for comparing the frequencies of two pulse trains and indicating a predetermined difference between them.

According to the present invention a pulse frequency comparison circuit arrangement for comparing the repetition frequencies of two pulse trains comprises a register means, operable to store a binary number, control means, operable to control the application of the pulse trains to the register such that pulses of one train cause the binary number to be increased and pulses of the other train cause the binary number to be decreased, setting means, responsive to a predetermined number of pulses of one pulse train to cause the register to store a predetermined binary number, and output means operable to give an indication when a specified upper or lower binary number is stored in said register means.

An embodiment of the present invention will now be described by way of example with reference to the accompanying drawing, in which the single FIGURE shows a schematic circuit arrangement according to the present invention.

The embodiment as described includes a plurality of bistable devices each of which is arranged to provide an output when set, and arranged to provide no output when reset.

The circuit arrangement 5 comprises control means 6, register means 7, setting means 8 and output means 9.

The two pulse trains are applied to input terminals 10 and 11 of the control means. A pulse of the first train, applied to the terminal 10, sets bistable devices 12 and 13. The output signal of the bistable device 12 opens a gate 14, to which the input terminal 11 is connected, and energizes a clock oscillator 15. The clock oscillator 15 has two output terminals 17 and 18 and provides a clock pulse at each output terminal alternately.

The output terminal of the bistable device 13 and the output terminal 17 of the clock oscillator 15 are connected as inputs to a NAND gate 19. The output terminal of the gate 19 is connected to the register means 7 and the output signal of the gate 19 provides an input signal to the register means 7. The register means comprises a shift register 20, an OR gate 21 and a shift pulse generator 22.

The output terminal of the gate 19 is also connected by way of an inverting gate 23 to a gate 24, which gate, when triggered, provides a reset pulse for the bistable device 13. The gate 24 is triggered by a pulse from a generator 25, itself triggered by each register shift pulse from the generator 22.

Thus for each input pulse applied to the terminal 10, the bistable device 13 is set, a clock pulse from the clock oscillator output 17 triggers the gate 19 and results in the information in the shift register being moved one place in a direction to the left in the FIGURE. The occurrence of the register shift pulse also causes, by means of generator 25 and gates 23 and 24, the bistable device 13 to reset after each input pulse has been used.

The output signal of the gate 14 is used to set a bistable device 16 coupled to gates 26, 27 and 28 corresponding to gates 19, 23 and 24, and to the OR gate 21. A pulse from the train applied to the terminal 11 sets the bistable device 16, and a clock pulse from the output 18 of the clock oscillator 15 enables the stored pulse to pass to the shift register 20 and cause the information in the shift register to move one place to the right in the FIGURE. The gates 27 and 28 and the generator 25 cause the bistable device 16 to reset after the register shift pulse.

The shift register 20 is an eight-bit reversible shift register and is arranged to be reset by an external signal with a bit in stage-five and with all the other stages empty. Output signals are taken from the first and eighth stages to the output means 9. The output means comprise bistable devices 29 and 30, set to provide output signals from the first and eighth stages of the shift register respectively.

The setting means 8 includes a counter 31 triggered by clocked pulses from the gate 27 and providing a parallel output in binary form. Appropriate ones of the parallel output terminals are connected to a multi-input gate 32, along with the output of the generator 25, to provide an output count signal after a predetermined number of control pulses from the terminal 11 have been applied to the shift register 20.

The count signal is applied by way of a two-input OR gate 33 to a setting-pulse generator 34. The generator applies a pulse operable to set the shift register 20 and reset the bistable devices 12 after the predetermined number of control pulses have been counted; the counter 31 is also cleared.

An external setting pulse may be applied, by way of a terminal 35, to the other input terminal of the OR gate 33 and operate to reset bistable devices 29 and 30.

In operation an external setting pulse is applied to the terminal 35 such that the bistable devices 29 and 30 are reset directly and the shift register 20 and the bistable device 12 are reset by generator 34. A first input pulse appearing at the terminal 10 sets the bistable device 12 so as to open the gate 14, and energise the clock oscillator 15. The first input pulse also sets the bistable device 13 and produces an input to the gate 19. The first clock pulse, from the output 17 of the clock oscillator 15, opens the gate 19 and a pulse is applied to the shift register 20 to cause the stored bit to move one place to the left, that is, to stage-four, after which the generator 25 resets the bistable device 13.

The first pulse applied to the terminal 11 is passed through gate 14 and sets the bistable device 16. The second clock pulse from the oscillator 15 is produced at the output 18 and this opens the gate 26 and applies the pulse to the shift register causing the stored bit to move one place to the right, that is, from stage-four back to stage-five. The pulse also increases the count in the counter 31 by one. After the register shift, the output of the generator 25 causes the bistable device 16 to be reset.

The second pulse applied to the input terminal 10 sets the bistable device 13 and when the third clock pulse appears, from the output 17, the pulse is applied to the shift register to move the bit to the left to stage-four. The second pulse applied to the terminal 11, after the fourth clock pulse, returns the bit to stage-five of the register, again adding to the count of the counter 31.

Thus while the input pulses are produced at the same repetition frequency, the stored bit is moved between the stages-four and-five of the shift register in response to the output of the clock oscillator. After a predetermined number of pulses have been received by the terminal 11 the counter 31 produces an output to satisfy the conditions of the gate 32 such that setting-pulse generator 34 is operated to set the shift register 20, returning the stored bit to stage-five and to reset the bistable device 12.

The next input pulse sets the bistable 12 and opens the gate 14 and operates the clock oscillator 15, so that the cycle of operations is repeated for a period determined by the counting of a predetermined number of pulses by the counter 31. The arrangement thus shown in the FIGURE has the counter 31 connected to the gate 32 to give an output from the gate after every twenty pulses.

If during one 20-pulse period, the frequency of the train applied to terminal 10 exceeds the frequency of the train applied to terminal 11 then there will be more pulses to move the stored bit to the left than pulses to move it to the right. If in the 20-pulse period there are 23 pulses applied to the terminal 10 then the stored bit will be caused to enter stage-one of the register and set the bistable device 29 to provide an error signal indicating that the input frequency is too high.

Similarly if the frequency of the train applied to the terminal 10 is below the frequency of the train applied to the terminal 11 then the stored bit is moved to the right where, if it reaches stage-eight it sets the bistable device 30 and produces an error signal indicative of a low frequency.

When steps have been taken to restore the input signal to its correct frequency the external reset is operated manually or automatically to reset the shift register and the bistable devices 29 and 30.

As shown the permitted error for the input signal is 3 pulses in twenty, that is ± 15%, but this may be changed by altering the reset position of the stored bit in the shift register, altering the interconnections between the counter 31 and the gate 32, or by altering the capacity of the counter 31 and/or the shift register.

The only condition for satisfactory operation is that the frequency of the clock oscillator must be greater than twice the maximum possible input frequency of either train to permit both train pulses to be sampled for each one input pulse of that train.

The register means may comprise a bi-directional counting circuit with the output signal arranged to be given for predetermined values of the stored count. Also, the circuit may be employed to measure the deviation of frequency of one input train of pulses from that of a train of pulses produced by a controlled oscillator. In such a case, the pulse train from such an oscillator should be applied to the input terminal 11 so that these accurately controlled pulses are counted in the counter 31. A suitable oscillator may be incorporated in the control means 6 in place of the gate 14, the oscillator being energised by the output of the bistable circuit 12 in a manner similar to the clock oscillator 15.

What is claimed is:

1. A pulse frequency comparison circuit arrangement for comparing the repetition frequencies of two pulse trains comprising register means operable to store a binary number and responsive to a pulse of one of said trains to cause the number to be increased and responsive to a pulse of the other of said trains to cause the number to be decreased, control means connected to said register means and adapted to receive said pulse trains and being operable to sample the pulse trains alternately and provide an output to the register means in response to the application any pulse appearing on each train since the previous sample of that train to the register means such that pulses of each train are applied, one at a time, and cause oscillation of the stored binary number between two adjacent values when the frequencies are the same and cause the binary number to increase or decrease when the frequencies are different, setting means connected to said control means and responsive to a predetermined number of pulses of one pulse train to cause the register means to store a predetermined binary number, and output means connected to said register means and operable to provide an indication when a specified upper or lower binary number is stored in said register means.

2. A frequency comparison circuit arrangement as claimed in claim 1 in which the register means comprises a shift register having a plurality of stages and operable to contain a binary digit in one stage only, said shift register being responsive to a sampled input pulse from one pulse train to move the binary digit to an adjacent stage in one sense and responsive to a sampled input pulse from the other pulse train to move the binary digit to an adjacent stage in the opposite sense, the binary digit being set to said one stage by said setting means.

3. A frequency comparison circuit as claimed in claim 2 wherein said output means includes an error signal indicator operable in response to an output signal from said shift register when the binary digit is displaced from said one stage by a predetermined number of stages in either direction.

4. A frequency comparison circuit as claimed in claim 1 in which the register means comprises a bidirectional counting circuit operable to count in one sense in response to the applied pulses associated with one train and in the opposite sense in response to the applied pulses of the other train and to provide output signals for predetermined values of count.

5. A pulse frequency comparison circuit arrangement for comparing the repetition frequencies of two pulse trains comprising register means including a shift register having an even number of stages, said register means being operable to store a binary number in one of the two center stages of said register, control means connected to said register means and adapted to receive said pulse trains and being operable to sample the pulse trains alternately and control the application of any pulse appearing on each train since the previous sample of that train to the register means such that pulses of each train are applied one at a time and cause oscillation of the stored binary number between said two center stages when the frequencies are the same and cause the binary number to increase or decrease when the frequencies are different, setting means connected to said control means and responsive to a predetermined number of pulses of one pulse train to cause the register means to store a predetermined binary number, and output means connected to said register means and operable to provide an indication when a specified upper or lower binary number is stored in said register means.

6. A pulse frequency comparison circuit arrangement for comparing the repetition frequencies of two pulse trains comprising register means operable to store a binary number and responsive to a pulse of one of said trains to cause the number to be increased and responsive to a pulse of the other of said trains to cause the number to be decreased, control means connected to said register means and adapted to receive said pulse trains, said control means being operable to sample the pulse trains alternately and provide an output to the register means in response to the application of any pulse appearing on each train since the previous sample of that train to the register means such that pulses of one train cause the stored binary number to be increased and pulses of the other train cause the stored binary number to decrease, said control means including two bistable switches, each switch being uniquely associated with one of said pulse trains and responsive to each input pulse of its associated pulse train to be set to provide an output signal and responsive to a reset pulse to provide no output signal, gating means associated with each bistable switch and operable to apply the switch output signal to the register means, reset means responsive to operation of the gating means to apply a reset pulse to the associated bistable switch, and oscillator means operable to provide clock pulses, at a repetition frequency at least twice the repetition frequency of the pulse trains, to operate the gating means alternately, setting means connected to said control means and responsive to a predetermined number of pulses of one pulse train to cause the register means to store a predetermined binary number, and output means connected to said register means and operable to provide an indication when a specified upper or lower binary number is stored in said register means.

7. A frequency comparison circuit as claimed in claim 6 in which the control means includes starting means comprising input gating means operable when open to permit pulses of one of the pulse trains to set its associated bistable switch and a bistable device, responsive to an input pulse of the other of said pulse trains to open the input gating means and to operate the oscillator means and responsive to said setting means to close the input gating means and stop the oscillator means.

8. A frequency comparison circuit as claimed in claim 7 in which the setting means comprises counting means operable to count the pulses applied to the register means from one of the bistable switches and to provide a count signal after a predetermined number of pulses have been counted, and a reset pulse generator responsive to the count signal to produce a setting pulse operable to set the register means and starting means.

9. A pulse frequency comparison circuit arrangement for comparing the repetition frequencies of two pulse trains comprising register means operable to store a binary number, control means connected to said register means and adapted to receive said pulse trains and being operable to sample the pulse trains alternately and provide an output to the register means in response to the application of the pulse trains such that pulses of one train cause the binary number to be increased and pulses of the other train cause the binary number to be decreased, setting means connected to said control means and being responsive to a predetermined number of pulses of one pulse train to cause the register means to store a predetermined binary number, and output means connected to said register means and being operable to provide an indication when a specified upper or lower binary number is stored in said register means, said output means including a first output bistable element responsive to a specified first binary number occurring in the register means to provide a first output signal and a second output bistable element responsive to a specified second binary number occurring in the register means to provide a second output signal.

10. A pulse frequency circuit arrangement for comparing the repetition frequencies of two pulse trains comprising a multi-stage register means having a digit set in one of its internal stages, control means connected to said register means and adapted to receive said pulse trains and being operable to sample the pulse trains alternately and provide an output to said means upon the application of any pulse appearing on each train since the previous samples of that train such that said pulses cause oscillation of the stored binary digit between two adjacent values, when the frequencies are the same and cause the digit to be shifted to an adjacent stage in one or the other direction when the frequencies are different, said control means including an oscillator having an operating frequency greater than twice the input frequency of either pulse train, setting means connected to said control means and responsive to a predetermined number of pulses of one pulse train to cause the register means to store a predetermined binary number, and output means connected to said register means and operable to provide an indication when a specified upper or lower binary number is stored in said register means.

* * * * *

UNITED STATES PATENT OFFICE
CERTIFICATE OF CORRECTION

Patent No. 3,971,994  Dated July 27, 1976

Inventor(s) Geoffrey Shepherd

It is certified that error appears in the above-identified patent and that said Letters Patent are hereby corrected as shown below:

Claim 1, column 4, line 5, after "application" insert --of--.

Claim 10, column 6, line 34, after "said", insert --register--.

Signed and Sealed this

Twenty-fifth Day of January 1977

[SEAL]

Attest:

RUTH C. MASON
*Attesting Officer*

C. MARSHALL DANN
*Commissioner of Patents and Trademarks*